(12) United States Patent
Deam

(10) Patent No.: US 6,710,994 B1
(45) Date of Patent: Mar. 23, 2004

(54) LOW POWER GATE TRIGGER CIRCUIT FOR CONTROLLING A SILICON-CONTROLLED RECTIFIER CIRCUIT

(75) Inventor: David R. Deam, San Ramon, CA (US)

(73) Assignee: Electric Power Research Institute, Inc., Palo Alto, CA (US)

( * ) Notice: Subject to any disclaimer, the term of this patent is extended or adjusted under 35 U.S.C. 154(b) by 95 days.

(21) Appl. No.: 09/797,264

(22) Filed: Feb. 28, 2001

Related U.S. Application Data

(60) Provisional application No. 60/186,000, filed on Mar. 1, 2000, provisional application No. 60/186,093, filed on Mar. 1, 2000, and provisional application No. 60/186,094, filed on Mar. 1, 2000.

(51) Int. Cl.$^7$ .................................................. H02H 3/00
(52) U.S. Cl. ......................................... 361/100; 361/54
(58) Field of Search ............................. 361/18, 54, 56, 361/86, 91.7, 91.8, 100; 363/54, 57, 97, 128, 135; 327/389, 390, 419, 420, 424, 428, 429, 438; 257/111, 119, 123, 124

(56) References Cited

U.S. PATENT DOCUMENTS

| | | | | | |
|---|---|---|---|---|---|
| 5,747,836 A | * | 5/1998 | Mariyama | ................... | 257/119 |
| 5,910,664 A | * | 6/1999 | Ajit | ............................. | 257/212 |
| 6,501,632 B1 | * | 12/2002 | Avery et al. | ................ | 361/111 |

* cited by examiner

*Primary Examiner*—Ronald W. Leja
(74) *Attorney, Agent, or Firm*—Pennie & Edmonds LLP

(57) ABSTRACT

A circuit for controlling a silicon-controlled rectifier includes a high breakdown voltage metal-oxide semiconductor field-effect transistor (MOSFET) connected to drive the gate of the silicon-controlled rectifier. The high breakdown voltage MOSFET is itself controlled by a gate voltage. The power requirements for the gate trigger circuit of a series string silicon-controlled rectifier are greatly reduced by using the high breakdown voltage MOSFET as a gate triggering circuit for the silicon-controlled rectifier. Because the MOSFET consumes little power, a limited power source, such as a snubber capacitor voltage that is developed during the OFF-state of the silicon-controlled rectifier, can be used to power the gate trigger circuit.

7 Claims, 1 Drawing Sheet

LOW POWER GATE TRIGGER CIRCUIT FOR CONTROLLING A SILICON-CONTROLLED RECTIFIER CIRCUIT

The present application claims the priority of U.S. provisional patent applications bearing Ser. Nos. 60/186,000, 60/186,093, and 60/186,094, all of which were filed on Mar. 1, 2000.

CROSS REFERENCES

The present application is related to the following applications which are incorporated herein by reference: U.S. Patent Application entitled "APPARATUS AND METHOD FOR UTILIZING A SNUBBER CAPACITOR TO POWER A SILICON-CONTROLLED RECTIFIER GATE TRIGGER CIRCUIT," and application Ser. No. 09/797,266 and U.S. Patent Application entitled "APPARATUS AND METHOD FOR ISOLATING A TRIGGER CIRCUIT OF A SILICON-CONTROLLED RECTIFIER," and application Ser. No. 09/797,265. All of the above applications are filed simultaneously herewith on Feb. 28, 2001.

BRIEF DESCRIPTION OF THE INVENTION

This invention relates generally to the field of power electronics. More particularly, this invention relates to a technique for utilizing a MOSFET trigger circuit as a silicon-controlled controlled rectifier gate trigger circuit.

BACKGROUND OF THE INVENTION

High voltage applications of power electronic switches require that many power electronic devices be in series. Each of these devices must have a gate trigger circuit and this circuit must have voltage isolation. This voltage isolation is typically attained by using transformers with isolated windings, which are capable of supplying continuous power to the gate trigger circuit. The power requirements for the gate trigger circuit are based on the power required to fire the silicon-controlled rectifier.

It would be highly desirable to reduce the amount of power that is required in these prior art circuits.

SUMMARY OF THE INVENTION

An embodiment of the present invention is a circuit for controlling a silicon-controlled rectifier. The circuit includes a high breakdown voltage metal-oxide semiconductor field-effect transistor (MOSFET) connected to drive the gate of the silicon-controlled rectifier. The high breakdown voltage MOSFET is itself controlled by a gate voltage.

In accordance with the invention, the power requirements for the gate trigger circuit of a series string silicon-controlled rectifier are greatly reduced by using a high breakdown voltage metal-oxide semiconductor field-effect transistor (MOSFET) circuit as a gate triggering circuit for the silicon-controlled rectifier. A limited power source, such as the snubber capacitor voltage that is developed during the OFF-state of the silicon-controlled rectifier can therefore be used to power the gate trigger circuit.

BRIEF DESCRIPTION OF THE DRAWING

For a better understanding of the invention, reference should be made to the following detailed description taken in conjunction with the accompanying drawing, in which.

DETAILED DESCRIPTION OF THE INVENTION

Figure 1:
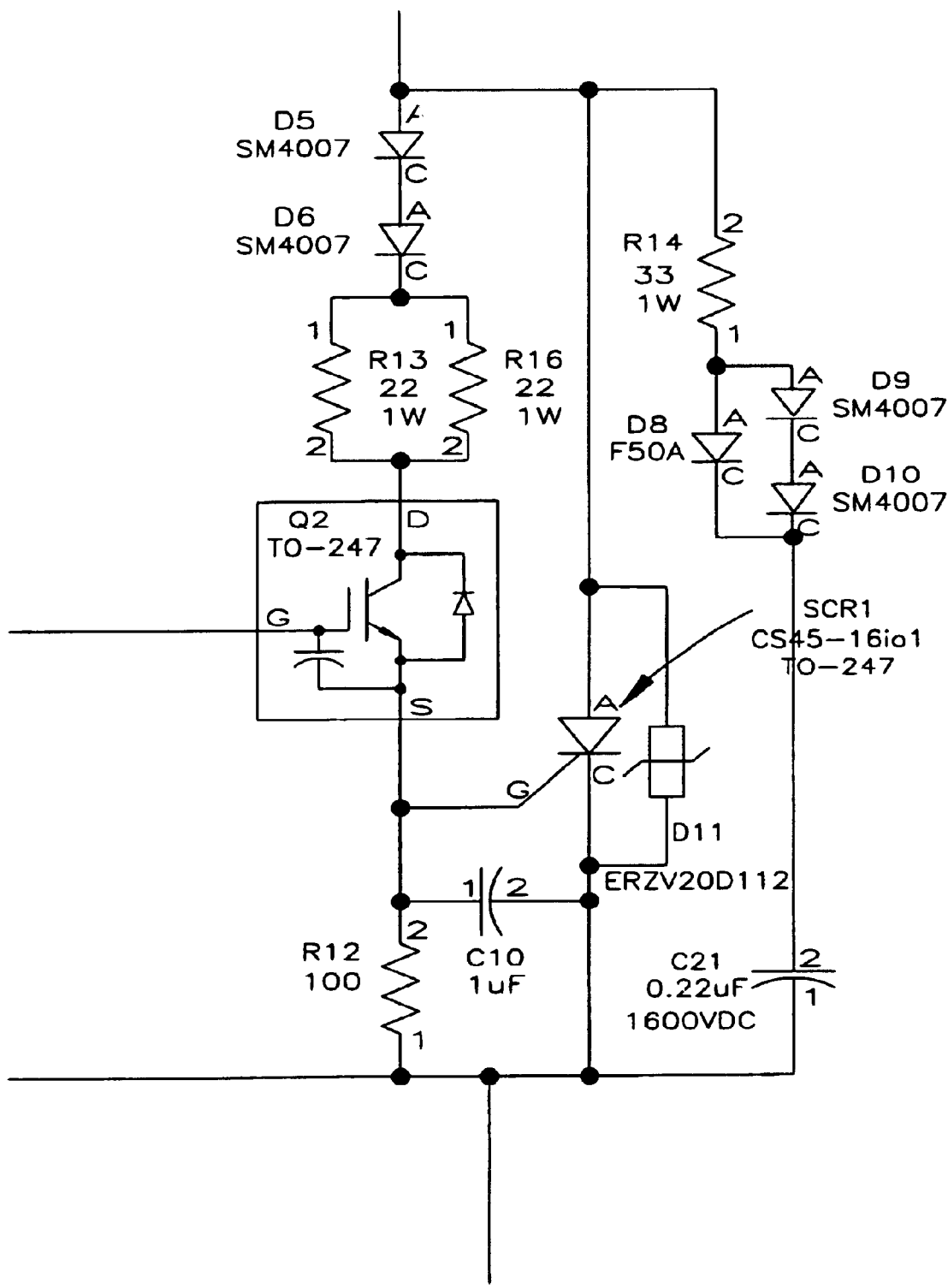
FIG. 1 illustrates a silicon-controlled rectifier coupled to be driven by a high breakdown voltage MOSFET circuit according to an embodiment of the invention.

FIG. 1 illustrates a MOSFET circuit Q2 utilized as a gate trigger circuit for a silicon-controlled rectifier in accordance with an embodiment of the invention. The circuitry shown in FIG. I is a portion of a power electronic switch circuit for use in soft-switching a high-voltage (e.g., approximately 13,800 Volts) power transmission line. The power electronic switch circuit is typically connected in series with a set of similarly configured power electronic switch circuits to achieve high voltage blocking capability.

A silicon-controlled rectifier (SCR), identified as SCR1 in FIG. 1, is only gated ON for short periods to eliminate switching transients until a parallel mechanical circuit breaker (not shown) is closed. SCR1 is a high breakdown voltage silicon-controlled rectifier having a breakdown voltage of 1600 volts.

Gate voltage is applied to the gate G of the MOSFET Q2 when SCR1 is to be gated on. This gate voltage causes the MOSFET Q2 to be turned ON. When the MOSFET Q2 is ON, it allows current to flow from its drain D to its source S, thus providing the necessary voltage and current to drive SCR1. Due to the nature of MOSFETs, a very low amount of power is required to keep the MOSFET Q2 in the ON state. Thus, the high breakdown voltage MOSFET circuit Q2 can be used as a gate trigger circuit, without requiring a transformer-based power supply.

Indeed, according to an embodiment of the present invention, the MOSFET Q2 is preferably coupled to receive power from a power supply circuit that is designed to hold the voltage for only a few seconds. A circuit for providing temporary power to the MOSFET Q2 is described in co-pending U.S. patent application entitled "APPARATUS. AND METHOD FOR UTILIZING A SNUBBER CAPACITOR TO POWER A SILICON-CONTROLLED RECTIFIER GATE TRIGGER CIRCUIT." By taking advantage of the need to operate this circuit only for closing and only for short periods of time, it is no longer necessary to include a costly transformer-based power supply circuit for providing power to the gate trigger circuit.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A power electronics switch circuit, comprising:

a silicon-controlled rectifier having a conducting state and a non-conducting state;

a high breakdown voltage metal-oxide semiconductor field-effect transistor (MOSFET) having a terminal coupled to a gate of the silicon-controlled rectifier, the MOSFET selectively controlling the conduction state of the silicon-controlled rectifier;

at least one resistor coupled between a drain terminal of said high breakdown voltage metal-oxide semiconductor field-effect transistor and a terminal of the silicon-controlled rectifier; and at least one diode coupled between the drain terminal of said high breakdown voltage metal-oxide semiconductor field-effect transistor and the terminal of the silicon-controlled rectifier.

2. The power electronics switch circuit of claim 1, wherein the high breakdown voltage MOSFET has a breakdown voltage of approximately 1600 Volts.

3. The power electronics switch circuit of claim 1, wherein the silicon-controlled rectifier has a breakdown voltage of approximately 1600 Volts.

4. The power electronics switch circuit of claim 1, further comprising a snubber capacitor for providing operating power to the high breakdown voltage MOSFET, said snubber capacitor coupled between the anode and cathode terminals of said silicon-controlled rectifier.

5. The power electronics switch circuit of claim 4, wherein the snubber capacitor is charged when the silicon-controlled rectifier is in a non-conducting state.

6. A power electronics switch circuit, comprising:

a silicon-controlled rectifier having a conducting state and a non-conducting state; and a high breakdown voltage metal-oxide semiconductor field-effect transistor (MOSFET) having a terminal directly connected to a gate of the silicon-controlled rectifier, the MOSFET selectively controlling the conduction state of the silicon-controlled rectifier;

at least one resistor coupled between a drain terminal of said high breakdown voltage metal-oxide semiconductor field-effect transistor and a terminal of the silicon-controlled rectifier; and at least one diode coupled between the drain terminal of said high breakdown voltage metal-oxide semiconductor field-effect transistor and the terminal of the silicon-controlled rectifier.

7. The power electronics switch circuit of claim 6, wherein the MOSFET has a source terminal directly connected to a gate of the silicon-controlled rectifier.

* * * * *